(12) United States Patent
Kraus et al.

(10) Patent No.: US 7,902,018 B2
(45) Date of Patent: Mar. 8, 2011

(54) FLUORINE PLASMA TREATMENT OF HIGH-K GATE STACK FOR DEFECT PASSIVATION

(75) Inventors: Philip Allan Kraus, San Jose, CA (US); Christopher Olsen, Fremont, CA (US); Khaled Z. Ahmed, Anaheim, CA (US)

(73) Assignee: Applied Materials, Inc., Santa Clara, CA (US)

( * ) Notice: Subject to any disclaimer, the term of this patent is extended or adjusted under 35 U.S.C. 154(b) by 590 days.

(21) Appl. No.: 11/861,578

(22) Filed: Sep. 26, 2007

(65) Prior Publication Data

US 2008/0076268 A1 Mar. 27, 2008

Related U.S. Application Data

(60) Provisional application No. 60/827,023, filed on Sep. 26, 2006.

(51) Int. Cl.
*H01L 21/8234* (2006.01)

(52) U.S. Cl. ............... 438/216; 438/591; 257/E21.625

(58) Field of Classification Search ............... 438/216, 438/591, 785, 774; 257/E21.625
See application file for complete search history.

(56) References Cited

U.S. PATENT DOCUMENTS

| | | | |
|---|---|---|---|
| 3,427,514 A | 2/1969 | Olmstead et al. |
| 3,594,295 A | 7/1971 | Meckel et al. |
| 4,043,848 A | 8/1977 | Bazin |
| 4,096,509 A | 6/1978 | Blaha et al. |
| 4,262,631 A | 4/1981 | Kubacki |
| 4,310,380 A | 1/1982 | Flamm et al. |
| 4,335,391 A | 6/1982 | Morris |
| 4,412,119 A | 10/1983 | Komatsu et al. |
| 4,439,463 A | 3/1984 | Miller |
| 4,459,739 A | 7/1984 | Shepherd et al. |
| 4,495,219 A | 1/1985 | Kato et al. |
| 4,534,826 A | 8/1985 | Goth et al. |

(Continued)

FOREIGN PATENT DOCUMENTS

EP 0 232 619 8/1987

(Continued)

OTHER PUBLICATIONS

A. Reisman, "Assisted Oxidation and Annealing in VLSI and ULSI", Department of Electrical and Comptuer Engineering, 1986, pp. 364-378.

(Continued)

*Primary Examiner*—Thanhha Pham
(74) *Attorney, Agent, or Firm*—Patterson & Sheridan, LLP

(57) ABSTRACT

Embodiments of the present invention generally provide a method for forming a dielectric material with reduced bonding defects on a substrate. In one embodiment, the method comprises forming a dielectric layer having a desired thickness on a surface of a substrate, exposing the substrate to a low energy plasma comprising a fluorine source gas to form a fluorinated dielectric layer on the substrate without etching the dielectric layer, and forming a gate electrode on the substrate. In certain embodiments, the fluorine source gas is a carbon free gas. In certain embodiments, the method further comprises co-flowing a gas selected from the group consisting of argon, helium, $N_2$, $O_2$, and combinations thereof with the fluorine source gas.

18 Claims, 6 Drawing Sheets

U.S. PATENT DOCUMENTS

| | | |
|---|---|---|
| 4,545,112 A | 10/1985 | Holmberg et al. |
| 4,563,367 A | 1/1986 | Sherman |
| 4,585,516 A | 4/1986 | Corn et al. |
| 4,605,947 A | 8/1986 | Price et al. |
| 4,608,063 A | 8/1986 | Kurokawa |
| 4,651,185 A | 3/1987 | Holmberg et al. |
| 4,700,458 A | 10/1987 | Suzuki et al. |
| 4,725,560 A | 2/1988 | Abernathey et al. |
| 4,743,953 A | 5/1988 | Toyokura et al. |
| 4,745,082 A | 5/1988 | Kwok |
| 4,851,370 A | 7/1989 | Doklan et al. |
| 4,913,929 A | 4/1990 | Moslehi et al. |
| 4,948,458 A | 8/1990 | Ogle |
| 4,980,307 A | 12/1990 | Ito et al. |
| 5,000,113 A | 3/1991 | Wang et al. |
| 5,063,431 A | 11/1991 | Ohshima |
| 5,173,442 A | 12/1992 | Carey |
| 5,228,950 A | 7/1993 | Webb et al. |
| 5,292,673 A | 3/1994 | Shinriki et al. |
| 5,302,236 A | 4/1994 | Tahara et al. |
| 5,314,724 A | 5/1994 | Tsukune et al. |
| 5,335,138 A | 8/1994 | Sandhu et al. |
| 5,391,510 A | 2/1995 | Hsu et al. |
| 5,464,783 A | 11/1995 | Kim et al. |
| 5,582,866 A | 12/1996 | White |
| 5,619,051 A | 4/1997 | Endo |
| 5,726,087 A | 3/1998 | Tseng et al. |
| 5,763,922 A | 6/1998 | Chau |
| 5,834,343 A | 11/1998 | Ogasawara et al. |
| 5,840,626 A | 11/1998 | Ohguro |
| 5,851,602 A | 12/1998 | Law et al. |
| 5,861,197 A | 1/1999 | Law et al. |
| 5,865,896 A | 2/1999 | Nowak et al. |
| 5,874,766 A | 2/1999 | Hori |
| 5,880,508 A | 3/1999 | Wu |
| 5,891,798 A | 4/1999 | Doyle et al. |
| 5,928,732 A | 7/1999 | Law et al. |
| 5,935,373 A | 8/1999 | Koshimizu |
| 5,937,303 A | 8/1999 | Gardner et al. |
| 5,960,270 A | 9/1999 | Misra et al. |
| 5,976,993 A | 11/1999 | Ravi et al. |
| 6,008,095 A | 12/1999 | Gardner et al. |
| 6,013,553 A | 1/2000 | Wallace et al. |
| 6,020,024 A | 2/2000 | Maiti et al. |
| 6,020,243 A | 2/2000 | Wallace et al. |
| 6,023,613 A | 2/2000 | Kanehara |
| 6,027,961 A | 2/2000 | Maiti et al. |
| 6,033,963 A | 3/2000 | Huang et al. |
| 6,041,734 A | 3/2000 | Raoux et al. |
| 6,043,157 A | 3/2000 | Gardner et al. |
| 6,049,114 A | 4/2000 | Maiti et al. |
| 6,054,013 A | 4/2000 | Collins et al. |
| 6,060,755 A | 5/2000 | Ma et al. |
| 6,063,704 A | 5/2000 | Demirlioglu |
| 6,066,533 A | 5/2000 | Yu |
| 6,077,403 A | 6/2000 | Kobayashi et al. |
| 6,083,836 A | 7/2000 | Rodder |
| 6,087,231 A | 7/2000 | Xiang et al. |
| 6,090,653 A | 7/2000 | Wu |
| 6,093,590 A | 7/2000 | Lou |
| 6,110,287 A | 8/2000 | Arai et al. |
| 6,117,279 A | 9/2000 | Smolanoff et al. |
| 6,130,123 A | 10/2000 | Liang et al. |
| 6,136,654 A | 10/2000 | Kraft et al. |
| 6,140,024 A | 10/2000 | Misium et al. |
| 6,140,688 A | 10/2000 | Gardner et al. |
| 6,162,709 A | 12/2000 | Roux et al. |
| 6,171,900 B1 | 1/2001 | Sun |
| 6,171,910 B1 | 1/2001 | Hobbs et al. |
| 6,184,072 B1 | 2/2001 | Kaushik et al. |
| 6,184,114 B1 | 2/2001 | Lukanc |
| 6,190,513 B1 | 2/2001 | Forster et al. |
| 6,200,893 B1 | 3/2001 | Sneh |
| 6,203,613 B1 | 3/2001 | Gates et al. |
| 6,207,304 B1 | 3/2001 | Law et al. |
| 6,228,229 B1 | 5/2001 | Raaijmakers et al. |
| 6,235,650 B1 | 5/2001 | Yao |
| 6,244,211 B1 | 6/2001 | Nishikawa et al. |
| 6,254,738 B1 | 7/2001 | Stimson et al. |
| 6,254,746 B1 | 7/2001 | Subramani et al. |
| 6,255,231 B1 | 7/2001 | Chen et al. |
| 6,255,698 B1 | 7/2001 | Gardner et al. |
| 6,258,675 B1 | 7/2001 | Gardner et al. |
| 6,264,812 B1 | 7/2001 | Raaijmakers et al. |
| 6,277,253 B1 | 8/2001 | Narasimhan et al. |
| 6,287,635 B1 | 9/2001 | Cook et al. |
| 6,291,282 B1 | 9/2001 | Wilk et al. |
| 6,297,107 B1 | 10/2001 | Paton et al. |
| 6,297,539 B1 | 10/2001 | Ma et al. |
| 6,297,595 B1 | 10/2001 | Stimson et al. |
| 6,303,481 B2 | 10/2001 | Park |
| 6,320,238 B1 | 11/2001 | Kizilyalli et al. |
| 6,323,555 B1 | 11/2001 | Maex et al. |
| 6,344,419 B1 | 2/2002 | Forster et al. |
| 6,345,588 B1 | 2/2002 | Simson |
| 6,346,465 B1 | 2/2002 | Miura et al. |
| 6,348,126 B1 | 2/2002 | Hanawa et al. |
| 6,348,386 B1 | 2/2002 | Gilmer |
| 6,352,594 B2 | 3/2002 | Cook et al. |
| 6,354,593 B1 | 3/2002 | Frommer et al. |
| 6,355,108 B1 | 3/2002 | Won et al. |
| 6,358,810 B1 | 3/2002 | Dornfest et al. |
| 6,361,667 B1 | 3/2002 | Kobayashi et al. |
| 6,365,450 B1 | 4/2002 | Kim |
| 6,365,518 B1 | 4/2002 | Lee et al. |
| 6,373,111 B1 | 4/2002 | Zheng et al. |
| 6,376,807 B1 | 4/2002 | Hong et al. |
| 6,399,520 B1 | 6/2002 | Kawakami et al. |
| 6,413,382 B1 | 7/2002 | Wang et al. |
| 6,420,279 B1 | 7/2002 | Ono et al. |
| 6,436,801 B1 | 8/2002 | Wilk et al. |
| 6,444,099 B1 | 9/2002 | Sasaki et al. |
| 6,444,592 B1 | 9/2002 | Ballantine et al. |
| 6,447,636 B1 | 9/2002 | Qian et al. |
| 6,448,166 B2 | 9/2002 | Cho et al. |
| 6,461,483 B1 | 10/2002 | Gopalraja et al. |
| 6,472,337 B1 | 10/2002 | Zhuang et al. |
| 6,475,854 B2 | 11/2002 | Narwankar et al. |
| 6,475,908 B1 | 11/2002 | Lin et al. |
| 6,477,980 B1 | 11/2002 | White et al. |
| 6,482,752 B1 | 11/2002 | Yamazaki et al. |
| 6,486,080 B2 | 11/2002 | Chooi et al. |
| 6,497,796 B1 | 12/2002 | Ashtiani et al. |
| 6,500,742 B1 | 12/2002 | Chern et al. |
| 6,504,214 B1 | 1/2003 | Yu et al. |
| 6,506,287 B1 | 1/2003 | Ding |
| 6,506,676 B2 | 1/2003 | Park et al. |
| 6,511,875 B2 | 1/2003 | Park et al. |
| 6,514,828 B2 | 2/2003 | Ahn et al. |
| 6,528,856 B1 | 3/2003 | Bai et al. |
| 6,528,858 B1 | 3/2003 | Yu et al. |
| 6,541,079 B1 | 4/2003 | Bojarczuk, Jr. et al. |
| 6,544,906 B2 | 4/2003 | Rotondaro et al. |
| 6,548,366 B2 | 4/2003 | Niimi et al. |
| 6,548,368 B1 | 4/2003 | Narwankar et al. |
| 6,551,446 B1 | 4/2003 | Hanawa et al. |
| 6,554,979 B2 | 4/2003 | Stimson |
| 6,610,374 B2 | 8/2003 | Tsai et al. |
| 6,610,615 B1 | 8/2003 | McFadden et al. |
| 6,617,209 B1 | 9/2003 | Chau et al. |
| 6,617,266 B2 | 9/2003 | Nickles et al. |
| 6,620,670 B2 | 9/2003 | Song et al. |
| 6,632,747 B2 | 10/2003 | Niimi et al. |
| 6,635,964 B2 | 10/2003 | Maex et al. |

| | | |
|---|---|---|
| 6,638,877 B2 | 10/2003 | Rotondaro |
| 6,641,703 B2 | 11/2003 | Nomura et al. |
| 6,649,538 B1 | 11/2003 | Cheng et al. |
| 6,652,924 B2 | 11/2003 | Sherman |
| 6,653,698 B2 | 11/2003 | Lee et al. |
| 6,660,134 B1 | 12/2003 | Gopalraja |
| 6,660,659 B1 | 12/2003 | Kraus et al. |
| 6,661,058 B2 | 12/2003 | Ahn et al. |
| 6,664,160 B2 | 12/2003 | Park et al. |
| 6,673,724 B2 | 1/2004 | Forster et al. |
| 6,675,816 B2 | 1/2004 | Ichijo |
| 6,677,254 B2 | 1/2004 | Narwankar et al. |
| 6,682,973 B1 | 1/2004 | Paton et al. |
| 6,689,646 B1 | 2/2004 | Joshi et al. |
| 6,719,883 B2 | 4/2004 | Stimson |
| 6,743,473 B2 | 6/2004 | Parkhe et al. |
| 6,759,286 B2 | 7/2004 | Kumar et al. |
| 6,765,178 B2 | 7/2004 | Shang et al. |
| 6,767,824 B2 | 7/2004 | Nallan et al. |
| 6,777,346 B2 | 8/2004 | Iyer |
| 6,780,720 B2 | 8/2004 | Burnham et al. |
| 6,784,033 B1 | 8/2004 | Yamazaki |
| 6,790,755 B2 | 9/2004 | Jeon |
| 6,806,095 B2 | 10/2004 | Nallan et al. |
| 6,806,653 B2 | 10/2004 | Strang et al. |
| 6,821,873 B2 | 11/2004 | Visokay et al. |
| 6,824,658 B2 | 11/2004 | Gopalraja et al. |
| 6,831,021 B2 | 12/2004 | Chua et al. |
| 6,841,439 B1 | 1/2005 | Anthony et al. |
| 6,846,516 B2 | 1/2005 | Yang et al. |
| 6,855,643 B2 | 2/2005 | Nallan et al. |
| 6,858,547 B2 | 2/2005 | Metzner et al. |
| 6,864,145 B2 | 3/2005 | Hareland et al. |
| 6,902,681 B2 | 6/2005 | Nallan et al. |
| 6,911,399 B2 | 6/2005 | Liu et al. |
| 6,919,251 B2 | 7/2005 | Rotondaro et al. |
| 6,924,191 B2 | 8/2005 | Liu et al. |
| 6,933,218 B1 | 8/2005 | Lee et al. |
| 6,946,408 B2 | 9/2005 | Le et al. |
| 6,960,537 B2 | 11/2005 | Shero et al. |
| 6,982,230 B2 | 1/2006 | Cabral, Jr. et al. |
| 6,998,357 B2 | 2/2006 | Bai et al. |
| 7,023,064 B2 | 4/2006 | Park et al. |
| 7,064,066 B1 | 6/2006 | Metz et al. |
| 7,067,439 B2 | 6/2006 | Metzner et al. |
| 7,084,024 B2 | 8/2006 | Gluschenkov et al. |
| 7,094,613 B2 | 8/2006 | Mui et al. |
| 7,094,704 B2 | 8/2006 | Jin et al. |
| 7,105,889 B2 | 9/2006 | Bojarczuk, Jr. et al. |
| 7,122,454 B2 | 10/2006 | Olsen |
| 7,175,713 B2 | 2/2007 | Thakur et al. |
| 7,179,754 B2 | 2/2007 | Kraus et al. |
| 7,208,361 B2 | 4/2007 | Shah et al. |
| 7,217,611 B2 | 5/2007 | Kavalieros et al. |
| 7,217,665 B2 | 5/2007 | Nallan et al. |
| 7,220,635 B2 | 5/2007 | Brask et al. |
| 7,235,501 B2 | 6/2007 | Ahn et al. |
| 7,242,055 B2 | 7/2007 | Bojarczuk, Jr. et al. |
| 7,279,413 B2 | 10/2007 | Park et al. |
| 7,294,581 B2 | 11/2007 | Iyer et al. |
| 7,304,004 B2 | 12/2007 | Metzner et al. |
| 2001/0049186 A1 | 12/2001 | Ibok |
| 2001/0055889 A1 | 12/2001 | Iyer |
| 2002/0023900 A1 | 2/2002 | Mahawili |
| 2002/0066537 A1 | 6/2002 | Ogino et al. |
| 2002/0142624 A1 | 10/2002 | Levy et al. |
| 2002/0177293 A1 | 11/2002 | Wilk et al. |
| 2002/0197883 A1 | 12/2002 | Niimi et al. |
| 2003/0027392 A1 | 2/2003 | Gousev et al. |
| 2003/0121886 A1 | 7/2003 | Strang et al. |
| 2003/0143328 A1 | 7/2003 | Chen et al. |
| 2003/0181012 A1 | 9/2003 | Want et al. |
| 2003/0205772 A1 | 11/2003 | Schaeffer et al. |
| 2003/0230549 A1 | 12/2003 | Buchanan et al. |
| 2003/0232491 A1 | 12/2003 | Wamaguchi |
| 2003/0232501 A1 | 12/2003 | Kher et al. |
| 2004/0020601 A1 | 2/2004 | Zhao et al. |
| 2004/0038486 A1 | 2/2004 | Chua et al. |
| 2004/0038487 A1 | 2/2004 | Olsen |
| 2004/0053472 A1 | 3/2004 | Kiryu et al. |
| 2004/0094808 A1 | 5/2004 | Joshi et al. |
| 2004/0135180 A1 | 7/2004 | Makita |
| 2004/0142577 A1 | 7/2004 | Sugawara et al. |
| 2004/0175961 A1 | 9/2004 | Olsen |
| 2004/0198069 A1 | 10/2004 | Metzner et al. |
| 2004/0209468 A1 | 10/2004 | Kumar et al. |
| 2004/0242021 A1 | 12/2004 | Kraus et al. |
| 2005/0009358 A1 | 1/2005 | Choi et al. |
| 2005/0026084 A1 | 2/2005 | Garza et al. |
| 2005/0130448 A1 | 6/2005 | Olsen |
| 2005/0186765 A1 | 8/2005 | Ma et al. |
| 2005/0230047 A1 | 10/2005 | Collins et al. |
| 2005/0260347 A1 | 11/2005 | Narwankar et al. |
| 2005/0260357 A1 | 11/2005 | Olsen |
| 2005/0271812 A1 | 12/2005 | Myo et al. |
| 2005/0271813 A1 | 12/2005 | Kher et al. |
| 2006/0019033 A1 | 1/2006 | Muthukrishnan et al. |
| 2006/0032833 A1 | 2/2006 | Kawaguchi et al. |
| 2006/0042755 A1 | 3/2006 | Holmberg et al. |
| 2006/0060565 A9 | 3/2006 | Nallan et al. |
| 2006/0062917 A1 | 3/2006 | Muthukrishnan et al. |
| 2006/0081558 A1 | 4/2006 | Collins et al. |
| 2006/0153995 A1 | 7/2006 | Narwankar et al. |
| 2006/0178018 A1 | 8/2006 | Olsen |
| 2006/0208215 A1 | 9/2006 | Metzner et al. |
| 2006/0244035 A1 | 11/2006 | Bojarczuk et al. |
| 2006/0264067 A1 | 11/2006 | Kher et al. |
| 2006/0286763 A1 | 12/2006 | Ma et al. |
| 2007/0018244 A1 | 1/2007 | Hung et al. |
| 2007/0020890 A1 | 1/2007 | Thakur et al. |
| 2007/0026547 A1 | 2/2007 | Kumar et al. |
| 2007/0042601 A1 | 2/2007 | Wang et al. |
| 2007/0049043 A1 | 3/2007 | Muthukrishnan et al. |
| 2007/0049053 A1 | 3/2007 | Mahajani |
| 2007/0077767 A1 | 4/2007 | Jin et al. |
| 2007/0087583 A1 | 4/2007 | Olsen et al. |
| 2007/0093012 A1 | 4/2007 | Chua et al. |
| 2007/0099438 A1 | 5/2007 | Ye et al. |
| 2007/0111458 A1 | 5/2007 | Sato et al. |
| 2007/0141856 A1 | 6/2007 | Sato et al. |
| 2007/0199922 A1 | 8/2007 | Shen et al. |
| 2007/0209930 A1 | 9/2007 | Chua et al. |
| 2007/0212896 A1 | 9/2007 | Olsen et al. |
| 2008/0050879 A1* | 2/2008 | Hung et al. ............ 438/287 |

FOREIGN PATENT DOCUMENTS

| | | |
|---|---|---|
| EP | 0 847079 | 6/1998 |
| TW | 386267 | 4/2000 |
| TW | 480569 | 3/2002 |
| TW | 490765 | 6/2002 |
| TW | 556268 | 10/2003 |

OTHER PUBLICATIONS

A.T. Fromhold, Jr. et al., "Oxide Growth in an rf Plasma", *J. Appl. Phys.* 51(12), Dec. 1980, pp. 6377-6392.

C.J. Dell'Oca, et al., "Anodic Oxide Films", *Physics of Thin Films*, vol. 6, H. Francombe and R. W. Hoffmann, Eds., Academic Press, Inc., New York, 1971, pp. 1-79.

D. W. Hess, "Plasma-Assisted Oxidation Anodization, and Nitridation of Silicon", *IBM J. Res. Develop*, vol. 43, No. ½, Jan./Mar. 1999, pp. 127-145.

D.L. Pulfrey, et al., "Preparation and Properties of Plasma-Anodized Silicon Dioxide Films", *Solid State Electronics*, 1974, vol. 17, pp. 627-632, Received on (Sep. 1973).

D.L. Pulfrey, et al., "The Anodization of Si in an RF Plasma", *Solid State Science and Technology*, 1974, vol. 120, No. 11, pp. 1529-1535, Nov. 1972.

D.R. Cote et al., "Plasma-Assisted Chemical Vapor Deposition of Dielectric Thin Films for ULSI Semiconductor Circuits", *IBM J. Res. Develop*, vol. 43, No. ½, Jan./Mar. 1999, pp. 5-38.

Deen, et al. Proceedings of the Symposium on "Silicon Nitride and Silicon Dioxide Thin Insulating Films", 1994, Electrochemical Society, Inc. vol. 97-10 pp. 229-243.

H. Carre et al., "Semiconductor Manufacturing Technology at IBM", *IBM J. Res. Develop*, vol. 26, No. 5, Sep. 1982, pp. 528-531.

H. F. Okorn-Schmidt, "Characterization of Silicon Surface Preparation Processes for Advanced Gate Dielectrics", *IBM J. Res. Develop*, vol. 43, No. 3, May 1999, pp. 351-365.

H. Nakanishi et al., "Studies on $SiO_2$_ $SiO_2$ Bonding with Hydrofluoric Acid—Room Temperature and Low Stress Bonding Technique for Mems—"; *IEEE*, 1998, pp. 609-614.

John F. O'Hanlon, "Gas Discharge Anodization", *Oxides and Oxide Films*, vol. 5, A.K. Vijh, Ed., Marcel Dekker, New York, 1977, *IBM Corporation*, Chpt. 2, pp. 105-166.

Kasprzak et al., "Near-Ideal $Si-SiO_2$ Interfaces", *IBM J. Res. Develop*, vol. 24, No. 3 May 1980, pp. 348-352.

Nelson et al., "Thin Silicon Oxides Grown by Low-Temperature RF Plasma Anodization and Deposition".

Oana, Yasuhisa "5.1: Current & Future Technology of Low Temperature Poly-Si TFT—LCDs" Toshiba Corporation pp. 1-4.

P. Fridel, et al., "Review of Oxidation Processes in Plasmas", *J. Physics Chem. Solids*, vol. 44, No. 5, pp. 353-364, 1983.

P.A. Kraus, et al., "Further Optimization of Plasma Nitridation of Ultra-Thin Oxides for 65-nm Node Mosfets." Semiconductor Fabtech, 23rd Edition, pp. 1-4.

P.K. Roy et al., "Stacked High-ϵ Gate Dielectric for Gigascale Integrated of Metal-Oxide-Semiconductor Technologies", *Applied Physics Letters*, vol. 72, No. 22, Jun. 1, 1998, pp. 2835-2837.

R. H. Collins et al., "Silicon Process Technology for Monolithic Memory", IBM J. Res. Develop, Jan. 1972, pp. 2-10.

S. Gourrier, et al., "Review of Oxide Formation in a Plasma", *Plasma Chemistry and Plasma Processing* vol. 1, No. 3, 1982, pp. 217-232 (Received Jan. 19, 1981).

S. Taylor et al., "A Review of the Plasma Oxidation of Silicon and its Applications", *Semiconductor Science Tech.* vol. 8, 1993, pp. 1426-1433, (Received Nov. 5, 1992.)

S.A. Nelson et al., "A Structural and Electrical Comparison of Thin SiO2 Films Grown on Silicon by Plasma Anodization and Rapid Thermal Processing to Furnace Oxidation", *Applied Physics Letters*, vol. 63, No. 10, May 15, 1988, pp. 5027-5035.

Vossen, et al., "Thin Film Processes", Academic Press Inc. 1978 Chpt II. pp. 24-73.

Y. Kawai, et al., "Ultra-Low-Temperature Growth of High-Integrity Gate Oxide Films by Low-Energy Ion-Assisted Oxidation", *Applied Physics Letters*, vol. 64, No. 17, Apr. 25, 1994, pp. 2223-2225.

Y. Kuo et al., "Plasma Processing in the Fabrication of Amorphous Silicon Thin-Films-Transistor Arrays", *IBM J. Res. Develop*, vol. 43, No. ½, Jan./Mar. 1999, pp. 73-88.

PCT International Search Report and Written Opinion dated Mar. 25, 2008 for International Application No. PCT/US2007/79544.

* cited by examiner

US 7,902,018 B2

FLUORINE PLASMA TREATMENT OF HIGH-K GATE STACK FOR DEFECT PASSIVATION

CROSS-REFERENCE TO RELATED APPLICATIONS

This application claims benefit of U.S. Provisional Patent Application No. 60/827,023, filed Sep. 26, 2006, which is herein incorporated by reference.

BACKGROUND OF THE INVENTION

Field of the Invention

Embodiments of the present invention generally relate to a method and an apparatus for depositing a high-k dielectric material on a substrate, and more specifically, to methods for depositing and stabilizing dielectric materials while forming a high-k gate stack.

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 65 nm or smaller and aspect ratios of 10 or greater are being considered. Since the demand for reduced device features remains, new gate dielectric materials and/or processes are needed.

Replacement of silicon dioxide ($SiO_2$) with new gate dielectric materials such as high-k dielectric type materials has presented challenges. For example, high-k dielectric materials are typically deposited using chemical vapor deposition (CVD) or atomic layer deposition (ALD) techniques that tend to cause the carbon containing precursor material and other contaminants to be incorporated in the deposited film. The carbon and other contaminants adversely affect the dielectric properties of the gate dielectric layer. Also, the quality of the interface between a chemical vapor deposition (CVD) or atomic layer deposition (ALD) deposited high-k film and the channel region is not as robust as a silicon dioxide layer.

Further, dielectric materials, such as high-k dielectric materials, may experience morphological changes when exposed to high temperatures (>500° C.) during subsequent fabrication processes. For example, titanium nitride is often deposited on hafnium oxide or zirconium oxide by a CVD process at about 600° C. At such high temperatures, the hafnium oxide or zirconium oxide may crystallize, losing amorphously and low leakage properties. Also, even if full crystallization of the dielectric material is avoided, exposure to high temperatures may form grain growth and/or phase separation of the dielectric material resulting in poor device performance due to high current leakage.

Therefore, there is a need for a process to form dielectric materials, especially high-k dielectric materials, which are morphologically stable with reduced bonding defects.

SUMMARY OF THE INVENTION

Embodiments of the present invention generally provide a method for forming a dielectric material with reduced bonding defects on a substrate. In one embodiment, the method comprises forming a dielectric layer having a desired thickness on a surface of a substrate, exposing the substrate to a low energy plasma comprising a fluorine source gas to form a fluorinated dielectric layer on the substrate without etching the dielectric layer, and forming a gate electrode on the substrate. In certain embodiments, the fluorine source gas is a carbon free gas. In certain embodiments, the method further comprises co-flowing a gas selected from the group consisting of argon, helium, $N_2$, $O_2$, and combinations thereof with the fluorine source gas. In certain embodiments the low energy plasma is formed using an inductive pulse radio frequency plasma process. In certain embodiments, the plasma is formed using a continuous wave capacitive source plasma. In certain embodiments, the plasma is formed using a continuous wave mixed inductive and capacitive source plasma.

In another embodiment method of forming a high-k gate stack is provided. The method comprises forming a high-k dielectric layer on a substrate. The substrate is exposed to a low ion energy fluorine containing plasma to passivate oxygen vacancies and other bonding defects in the high-k gate stack. A gate electrode is formed on the substrate. In certain embodiments, the high-k dielectric layer is a metal oxide containing layer. In certain embodiments, the high-k dielectric layer is annealed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
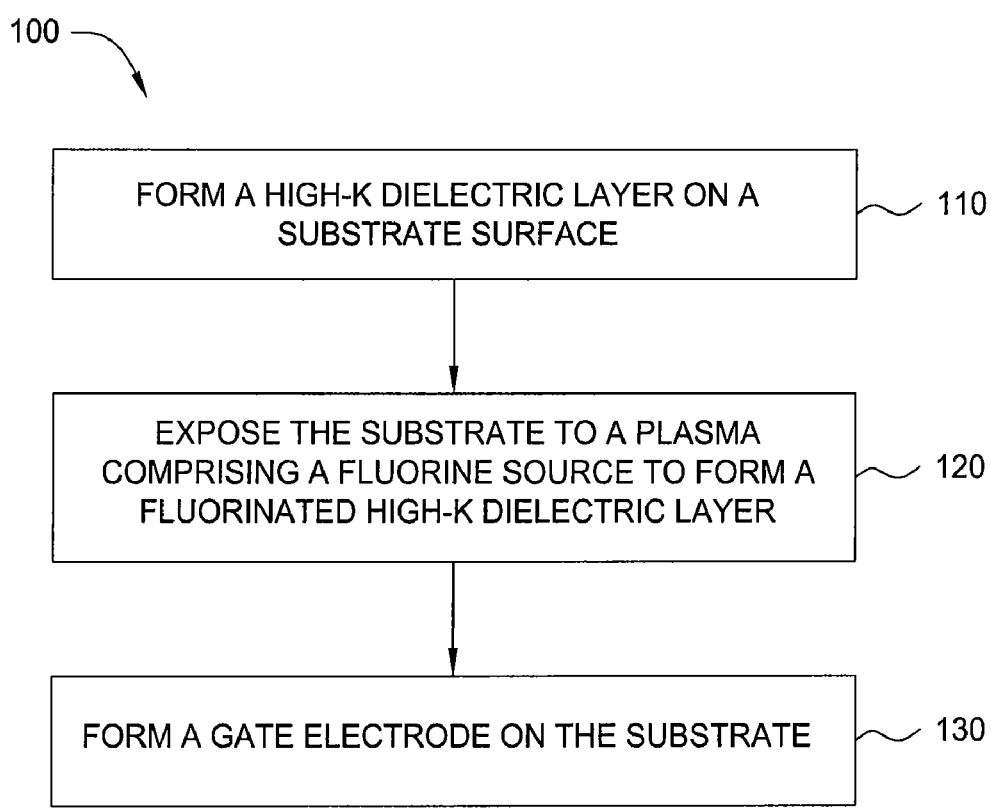
FIG. 1 is a flow diagram in accordance with one embodiment of the present invention.
Figure 2A:
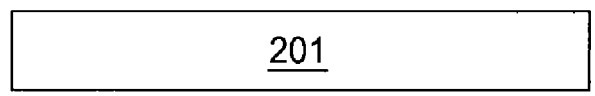
FIGS. 2A-2D depict a substrate during various stages of the process sequence referred to in FIG. 1.
Figure 2B:
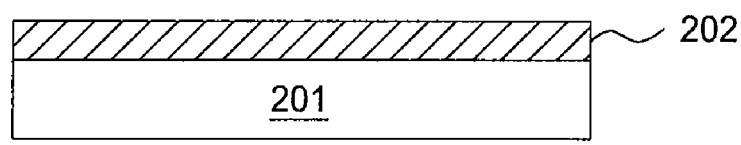
Figure 2C:
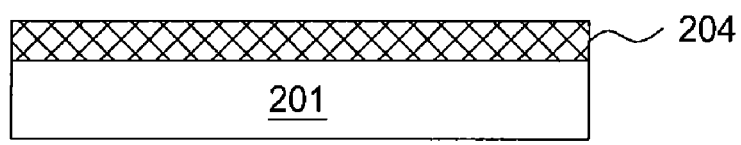
Figure 2D:
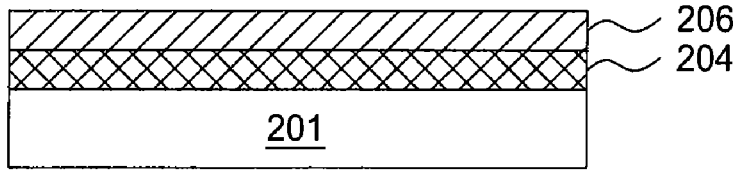

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the present invention generally relate to a method and an apparatus for depositing a high-k dielectric material on a substrate, and more specifically, to methods for depositing and stabilizing dielectric materials while forming a high-k gate stack. Fluorine bearing plasmas are used to passivate oxygen vacancies and other bonding defects in a high-k gate stack. Plasma fluorination may be accomplished in single substrate plasma reactors. Plasma fluorination may be in-situ where the single wafer plasma reactor is clustered with high-k deposition or post-deposition treatments thus allowing for further processing prior to exposure to ambient. Successful implementation of plasma fluorination requires low ion energy plasmas to prevent ion bombardment damage and associated halogen etching. The low ion energy plasma may be formed using an inductive pulse plasma, a continuous wave capacitive source plasma, and a continuous wave mixed inductive and capacitive source plasma.

As used herein, the term "high-k dielectric" generally refers to a variety of compositions that are homogenous, heterogeneous, graded and/or multiple layered stacks or laminates. The high-k dielectric may include combinations of hafnium, zirconium, titanium, tantalum, lanthanum, aluminum, silicon, oxygen and/or nitrogen. High-K dielectric materials may include silicon oxynitrides ($SiO_xN_y$), hafnium containing materials, such as hafnium oxides ($HfO_x$ including $HfO_2$), hafnium silicates ($HfSi_xO_y$ including $HfSiO_4$), hafnium, silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium containing materials, such as zirconium oxides ($ZrO_x$ including $ZrO_2$), zirconium silicates ($ZrSi_xO_y$ including $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), other suitable materials, composites thereof, and combinations thereof. Other high-K dielectric materials useful for dielectric layers may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for high-K dielectric layers include $HfO_2/Al_2O_3$, $HfO_2/SiO_2$, $La_2O_3/Al_2O_3$ and $HfO_2/SiO_2/Al_2O_3$.

As used herein, the term "substrate" generally refers to any substrate or material surface formed on a substrate upon which film processing is performed. For example, a substrate on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Processes of the embodiments described herein deposit dielectric materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

As used herein, the term "Atomic layer deposition" or "cyclical deposition" generally refers to the sequential introduction of two or more reactive compounds to deposit a layer of material on a substrate surface. The two, three or more reactive compounds may alternatively be introduced into a reaction zone of a process chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B and a third precursor containing compound C are each separately pulsed into the process chamber. Alternatively, a pulse of a first precursor may overlap in time with a pulse of a second precursor while a pulse of a third precursor does not overlap in time with either pulse of the first and second precursors.

As used herein, the term "pulse" generally refers to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein is intended to refer to a pulse of precursor step followed by a purge step.

To facilitate understanding, the following description will refer to plasma fluorination of a high-k dielectric layer incorporated into a high-k dielectric stack. However, those skilled in the art will recognize that the plasma fluorination process described herein may be used with a number of different semiconductor applications.

Exemplary Embodiment

FIG. 1 is a flow chart of one embodiment of a method 100 of forming a fluorinated high-K dielectric layer on a substrate surface. FIGS. 2A-2D correspond to method 100 to illustrate the formation of a dielectric material used in a semiconductor devices, such as a transistor or a capacitor. In step 110, a high-K dielectric layer 202 is formed on a substrate 201. In step 120, the substrate 201 is exposed to a plasma comprising a fluorine source to form a fluorinated high-k dielectric layer 204. In step 130, a gate electrode 206 is formed on the substrate 201.

The high-K dielectric layer 202 of step 110 may be deposited on a substrate by conventional deposition techniques such as atomic layer deposition (ALD), chemical vapor deposition (CVD), physical vapor deposition (PVD), thermal and plasma techniques and combinations thereof. In a preferred embodiment, the high-k dielectric layer 202 is deposited by an ALD process and apparatus, such as described in copending United States Patent Application Publication No. 2005/0271812, published Dec. 8, 2005, entitled, "Apparatuses And Methods For Atomic Layer Deposition of Hafnium-containing High-K Dielectric Materials," assigned to Applied Materials, Inc., and herein incorporated by reference. The high-k dielectric layer 202 is generally deposited with a film thickness from about 10 Å to about 1000 Å, preferably from about 20 Å to about 500 Å and more preferably from about 50 Å to about 200 Å, for example, about 100 Å. An optional pre-clean step may be performed prior to deposition of the high-k dielectric layer 202 on the substrate 201. Examples of suitable high-k deposition chambers include the FLEXSTAR®, which is commercially available from Applied Materials, Inc., Santa Clara, Calif.

During fluorination of the high-k dielectric layer 202 to form the fluorinated high-k dielectric layer 204 of step 120, the substrate is bombarded with atomic-F formed by co-flowing $F_2$ and an inert gas plasma such as argon. Besides $F_2$, other fluorine-containing gases may be used to form the fluorine plasma, such as $NF_3$, HF, or combinations thereof. Other inert gases that may be used include helium, neon, and xenon. Other gases such as nitrogen and oxygen may be used in place of or in combination with the inert gases. Preferably, the gases used in this process are carbon free. In one embodiment, the fluorination process proceeds at a time period from about 10 seconds to about 360 seconds, preferably from about 30 seconds to about 180 seconds, for example, about 120 seconds. The fluorination process generally occurs at a temperature less than 100° C., for example, between about 50° C. and less than 100° C. Also, the fluorination process is conducted with a plasma power setting from about 50 watts to about 2,500, for example between about 50 watts to about 1000 watts, such as between about 70 watts to 200 watts and a pressure from about 10 mTorr to about 100 mTorr. The fluorine has a flow rate from about 0.1 slm to about 1.0 slm. The individual and total gas flows of the processing gases may vary based upon a number of processing factors, such as the size of the processing chamber, the temperature of the processing chamber, and the size of the substrate being processed. In a preferred embodiment, the fluorination process uses moderate density low ion energy fluorine plasma. Low ion energy pulsed fluorine bearing plasmas allow for the incorporation of fluorine into high-k gate stacks without sufficient energy for ion etching. The concentration of fluorine in the fluorinated dielectric layer is between 1E14 atoms/$cm^2$ and 4E15 atoms/$cm^2$.

In another embodiment, plasma fluorination is performed in a chamber with pressure ranging from about 5-20 mTorr or 10-20 mTorr, with a plasma power of 200-800 Watts, for example, between about 250 watts and about 600 watts. The fluorine gas may be flown into the chamber at a flow rate ranging from about 100-200 sccm. In one embodiment, the plasma fluorination uses a pulse radio frequency plasma process at about 10-20 MHz and pulse at about 5-15 kHz. The plasma fluorination process parameters can be modified depending on the chamber size and volume, and the desired thickness of the dielectric film. An optional anneal step may be performed prior to or after the plasma fluorination process. The plasma fluorination process parameters are selected so that sufficient energy for etching of the dielectric is not available.

The gate electrode 206 of step 130 may be deposited on the substrate 201 after the structure is exposed to the plasma and annealed, a gate electrode 206, such as a polysilicon layer, an amorphous silicon layer, or a metal layer, such as titanium, titanium nitride, tantalum, tantalum nitride, tungsten, tungsten nitride, and other refractory metals or other suitable electrode materials may be deposited on the fluorinated high-k dielectric layer 204.

Figure 3:
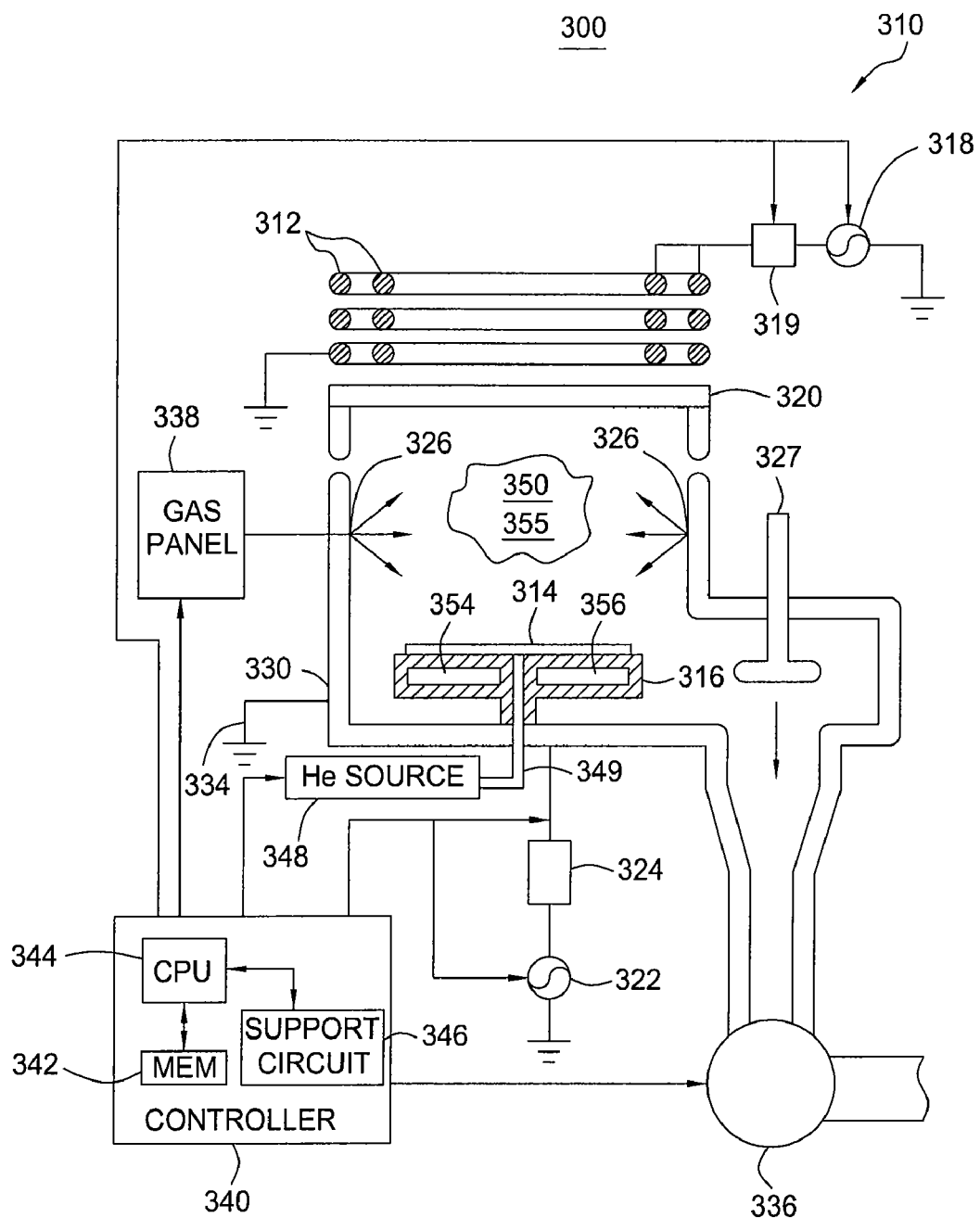
FIG. 3 is a schematic diagram of a plasma reactor for use with embodiments of the present invention.

FIG. 3 is a schematic diagram of a plasma process reactor 300, made by Applied Materials, Inc., located in Santa Clara, Calif. It is an inductive plasma source reactor that is one example of a reactor that may be used to practice the present invention.

The reactor 300 comprises a process chamber 310 having an electrostatic chuck 316 within a conductive body (wall) 330, and a controller 340. The chamber 310 is supplied with a substantially flat dielectric ceiling 320. Other modifications of the chamber 310 may have other types of ceilings, e.g., a dome-shaped ceiling. Above the ceiling 320 is disposed an antenna comprising at least one inductive coil element 312 (two co-axial elements 312 are shown). The inductive coil element 312 is coupled, through a first matching network 319, to a plasma power source 318. The plasma power source 318 typically is capable of producing up to 3000 W at a tunable frequency in a range, for example, from 50 kHz to 13.56 MHz.

The electrostatic chuck 316 includes a first electrode 354 and a second electrode 356 embedded in a dielectric material. The first electrode 354 and second electrode 356 are biased with DC potentials to provide the chucking action that holds the substrate 314. Application of the chucking voltage to the electrostatic chuck 316 and wafer spacing mask produces charge distribution along the underside of the substrate 314 and over the surface of the electrostatic chuck 316. The opposite polarity of these charges produces an attractive electrostatic force between the substrate 314 and the electrostatic chuck 316. This force retains the substrate 314 upon the chuck 316 without relying upon a plasma within the processing chamber 310 to provide a conductive grounding path for the substrate 314. The electrostatic chuck 316 may also be a monopolar chuck.

The electrostatic chuck 316 is coupled, through a second matching network 324, to a biasing power source 322. The biasing power source 322 is generally capable of producing a RF signal having a tunable frequency of 50 kHz to 13.56 MHz and a power of between 0 and 5000 watts. Optionally, the biasing power source 322 may be a DC or pulsed DC source. A controller 340 comprising a central processing unit (CPU) 344, a memory 342, and support circuits 346 for the CPU 344 and facilitates control of the components of the chamber 310 and, as such, of the nitridation process as discussed.

In another embodiment, the voltage for operating the electrostatic chuck 316 can be supplied by a separate "chuck" power supply (not shown). One output terminal of the chucking power supply is connected to the chuck electrode. The other output terminal typically is connected to electrical ground, but alternatively may be connected to a metal body portion of the electrostatic chuck 316. In operation, the substrate is placed in contact with the dielectric material, and a direct current voltage is placed on the electrode to create the electrostatic attractive force or bias to adhere the substrate on the upper surface of the electrostatic chuck 316.

In operation, a semiconductor wafer 314 is placed on the electrostatic chuck 316 and process gases are supplied from a gas panel 338 through entry ports 326 to form a gaseous mixture 350. The gaseous mixture 350 is ignited to form a plasma 355 in the chamber 310 by applying power from the plasma power source 318. The pressure within the interior of the chamber 310 is controlled using a throttle valve 327 and a vacuum pump 336. Typically, the chamber wall 330 is coupled to an electrical ground 334. The temperature of the wall 330 is controlled using liquid-containing conduits (not shown) that run through the wall 330.

The temperature of the substrate 314 is controlled by stabilizing a temperature of the electrostatic chuck 316. In one embodiment, helium gas from a gas source 348 is provided via a gas conduit 349 to channels (not shown) formed in the surface of the electrostatic chuck 316 to a fine space (not shown) formed between the reverse surface of the substrate 314 and the upper surface of the electrostatic chuck 316. During processing, the electrostatic chuck 316 may be heated by a resistive heater (not shown) within the pedestal of the electrostatic chuck 316 to a steady state temperature and then the helium gas facilitates uniform heating of the substrate 314.

To facilitate control of the process chamber 310 as described above, the controller 340 may be one of any form of general-purpose, computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as a software routine. The software routine may also be stored and/or executed by a second CPU (not shown) that is remotely located from the hardware being controlled by the CPU 344.

Other details of the Decoupled Plasma Nitridation process reactor 300 are described in U.S. Patent Application Publication No. 2004/0242021, entitled "Method and Apparatus for Plasma Nitridation of Gate Dielectrics Using Amplitude Modulated Radio Frequency Energy," assigned to Applied Materials, Inc., published Dec. 2, 2004, issued as U.S. Pat. No. 7,179,754, and herein incorporated by reference to the extent not inconsistent with the invention. Examples of suitable DPN chambers include the DPN Centura™, which is commercially available from Applied Materials, Inc., Santa Clara, Calif. Other suitable plasma chambers include the P3i chamber, which is also commercially available form Applied Materials, Inc.

Figure 4:
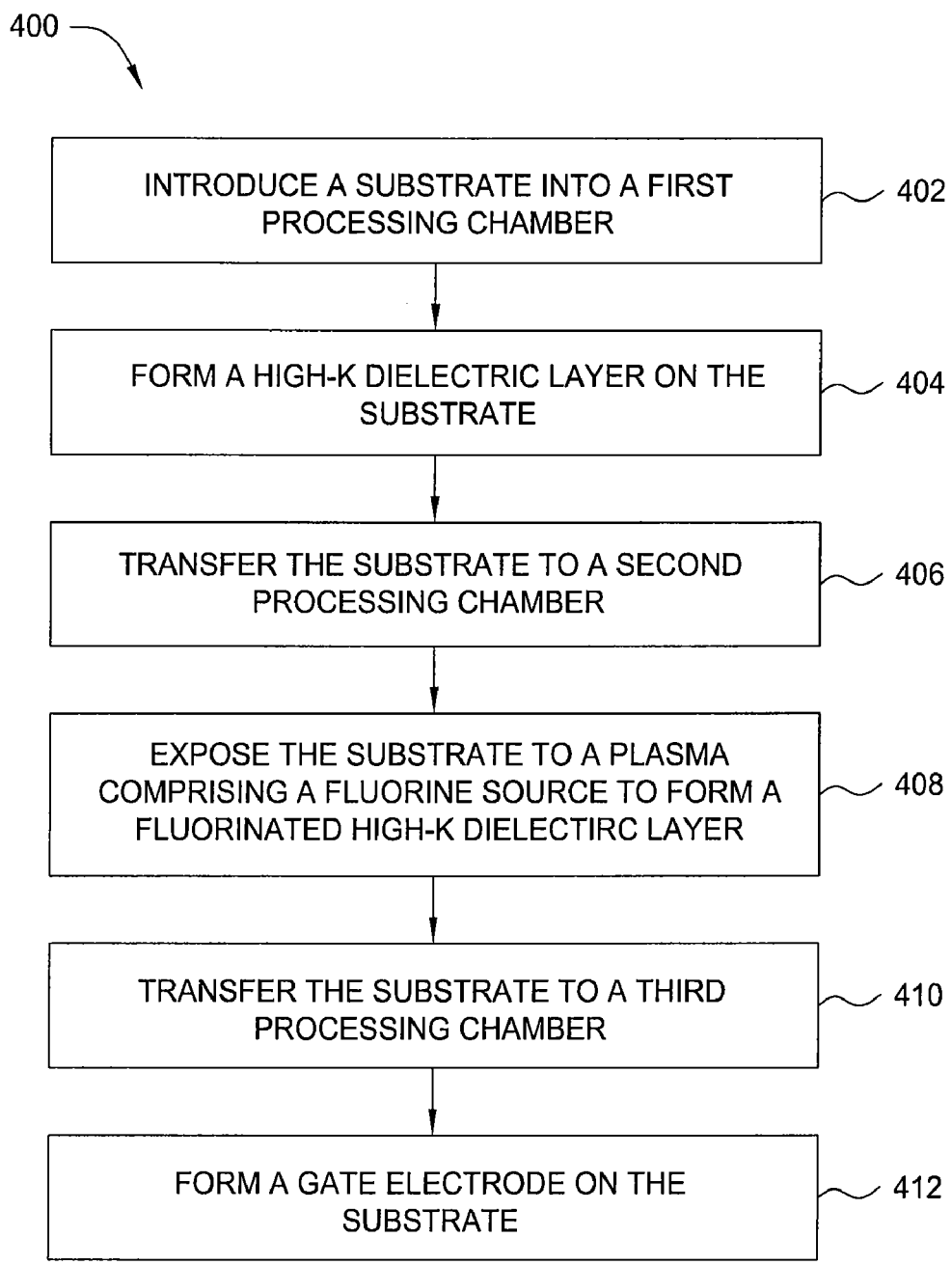
FIG. 4 is a flow diagram in accordance with one embodiment of the present invention.

FIG. 4 is a flow diagram of a method 400 in accordance with one embodiment of the present invention. Optionally, the surface of the substrate may be cleaned to remove native oxides which may have formed on the surface of the substrate. The process starts with introducing a silicon substrate into a first processing chamber at step 402. About 5 Å to about 100 Å of hafnium silicate (HfSiO$_x$) is grown on a silicon wafer at step 404. A detailed description of the surface cleaning and high-k dielectric layer formation is provided in United States Patent Application Publication No. 2003/0232501, published Dec. 18, 2003, entitled "Surface Pre-Treatment For Enhancement Of Nucleation Of High Dielectric Constant Materials," assigned to Applied Materials, Inc., and herein incorporated by reference. The hafnium silicate layer is one example of a material deposited using this method. The invention can be applied to other types of gate dielectrics, which could be a high-K dielectric material having a dielectric constant greater than 4.0. The invention may also be applied to silicon oxynitrides.

Optionally, the substrate may be transferred to an anneal chamber, such as the CENTURA™ RADIANCE™ rapid thermal processing (RTP) chamber available from Applied Materials, Inc., located in Santa Clara, Calif., for a post deposition annealing of the HfSiO$_x$ film. A post deposition anneal may be performed where the substrate is annealed at a temperature from about 500° C. to about 1200° C., preferably from about 550-700° C. for a time period from about 1 second to about 240 seconds, preferably from about 30 seconds to about 90 seconds, for example, at about 650° C. for about 60 seconds. Generally, the anneal chamber atmosphere contains at least one anneal gas, such as $O_2$, $N_2$, $NH_3$, $N_2H_4$, NO, $N_2O$, or combinations thereof. The anneal chamber is maintained at a pressure from about 5 Torr to about 100 Torr, for example, at about 50 Torr.

In step 406, the substrate is then transferred into a plasma chamber containing at least a fluorine-containing gas. In a preferred embodiment, the fluorination process uses moderate density low ion energy fluorine plasma. Low ion energy pulsed fluorine bearing plasmas allow for the incorporation of fluorine into high-k gate stacks without sufficient energy for ion etching. The fluorination process may be performed using an inductive pulse plasma, a capacitive source plasma, or continuous wave mixed inductive and capacitive source plasma.

Optionally, the substrate is transferred back to the RTP processing chamber where a post fluorination anneal step is performed. During the post fluorination anneal, the substrate is annealed at a temperature from about 600° C. to about 1200° C., preferably from about 700-1100° C. for a time period from about 1 second to about 120 seconds, preferably from about 30 seconds to about 90 seconds, for example, at about 1000° C. for about 60 seconds. Generally, the anneal chamber atmosphere contains at least one anneal gas, such as $O_2$, $N_2$, $NH_3$, $N_2H_4$, NO, $N_2O$, or combinations thereof. The anneal chamber is maintained at a pressure from about 5 Torr to about 100 Torr, for example, at about 15 Torr. Alternatively, the post fluorination anneal comprises a two-step process in which an inert or reducing step is followed by an oxidizing step.

After forming the fluorinated high-k dielectric layer, a gate electrode, such as polysilicon may be deposited by low pressure chemical vapor deposition (LPCVD), atomic layer epitaxy (ALE), thermal decomposition methods, or other methods known in the art. The polysilicon layer generally contains dopants such as boron, phosphorous or arsenic. The gate electrode can also be a metal layer.

Figure 5:
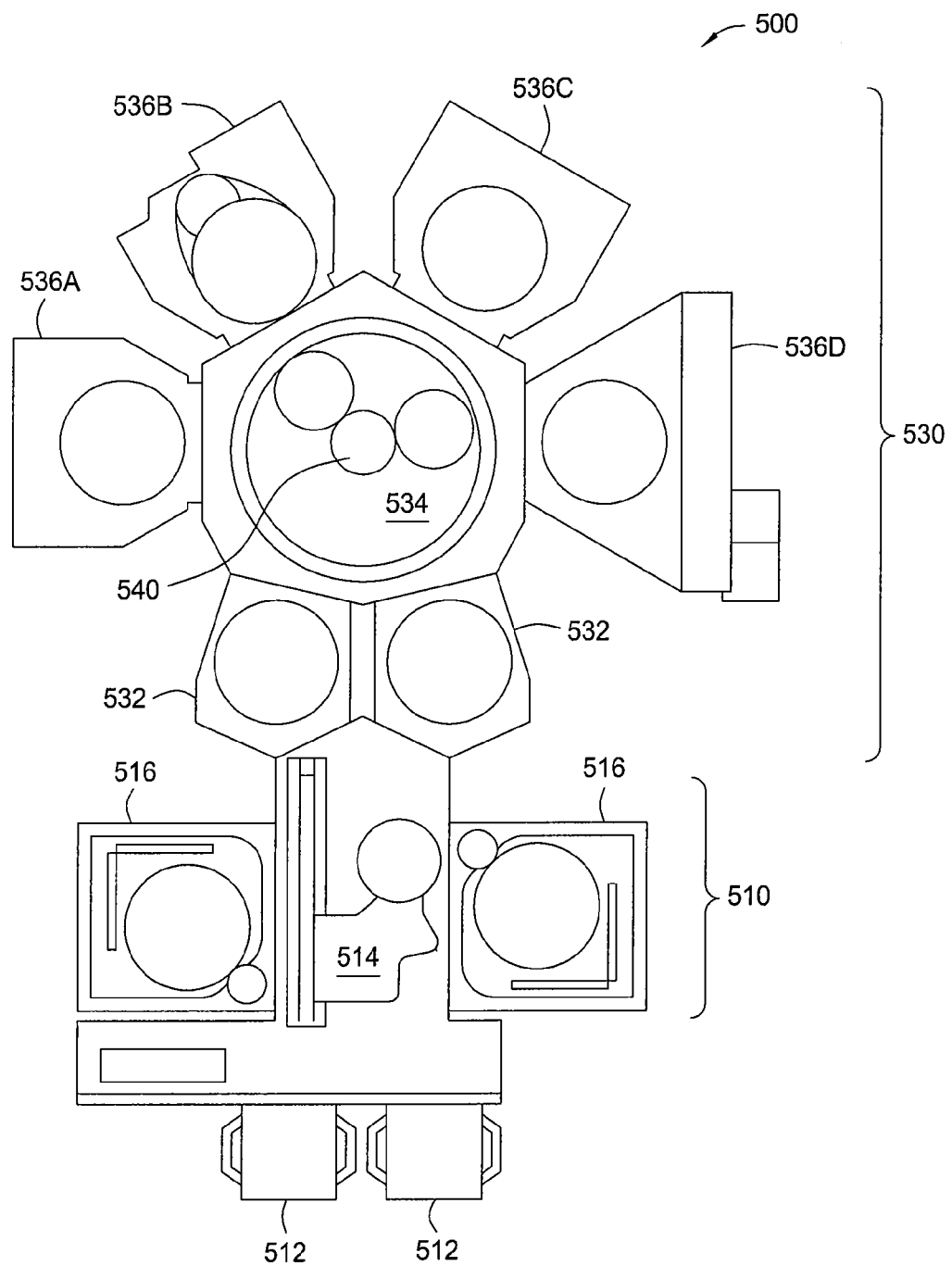
FIG. 5 is a schematic view of an integrated processing system for use with embodiments of the present invention.

FIG. 5 is a schematic view of an integrated processing system 500 capable of performing the processes disclosed herein. The integrated system 500 comprises a cleaning module 510 and a thermal processing/deposition mainframe system 530. As shown in FIG. 5, the cleaning module 510 is an OASIS CLEAN™ system, available from Applied Materials, Inc., located in Santa Clara, Calif. The thermal processing/deposition mainframe system 530 is a CENTURA® system and is also commercially available from Applied Materials, Inc., located in Santa Clara, Calif. This particular embodiment of the system to perform the process as disclosed herein is provided to illustrate the invention and should not be used to limit the scope of the invention.

The cleaning module 510 generally includes one or more substrate cassettes 512, one or more transfer robots 514 disposed in a substrate transfer region, and one or more single-substrate clean chambers 516. Other aspects and embodiments of a single-substrate clean system are disclosed in U.S. Patent Application Publication No. 2002/0029788, published Mar. 14, 2002, entitled "Method and Apparatus for Wafer Cleaning" and in U.S. Patent Application Publication No. 2002/0063169, published May 30, 2002, entitled "Wafer Spray Configurations for a Single Wafer Processing Apparatus," both of which are herein incorporated by reference in their entirety to the extent not inconsistent with the present disclosure.

The thermal processing/deposition mainframe system 530 generally includes load lock chambers 532, a transfer chamber 534, and processing chambers 536A, 536B, 536C, and 536D. The transfer chamber 534 is preferably between 1 mTorr to about 100 Torr and preferably comprises a non-reactive gas ambient, such as a $N_2$ ambient. The load lock chambers 532 allow for the transfer of substrates into and out from the thermal processing/deposition mainframe system 530 while the transfer chamber 534 remains under a low pressure non-reactive environment. The transfer chamber includes a robot 540 having one or more blades which transfers the substrates between the load lock chambers 532 and processing chambers 536A, 536B, 536C, and 536D. Any of the processing chambers 536A, 536B, 536C, or 536D may be removed from the thermal processing/deposition mainframe system 530 if not necessary for the particular process to be performed by the system 530.

It is believed that it is advantageous to perform the optional pre-treatment step and the high-K dielectric layer formation on a mainframe system to reduce the formation of native oxides and/or contamination of the pre-treated surface of a substrate prior to formation of the high-K dielectric layer. In other embodiments, the pre-treatment step may include polishing, etching, reduction, oxidation, hydroxylation, annealing and/or baking. Exposing the substrate to air between the pre-treatment step and the high-K dielectric layer formation may reduce the effectiveness of nucleation thereover of high-K dielectric materials. It is optional to have the cleaning module 510 coupled with mainframe system 530 as shown in FIG. 5 to further reduce the formation of native oxides over and/or contamination of substrates between cleaning steps and other processing steps. Of course, in other embodiments, cleaning steps may be performed in a cleaning module separate from the thermal processing/deposition mainframe system.

It is further believed that in-situ fluorination of the high-k gate stack prior to the deposition of the gate electrode, either metal or polysilicon, prevents unwanted chemical reactions at the interface between the gate dielectric and the gate electrode. Passivation of oxygen vacancies in the high-k material prior to deposition of the gate electrode is believed to present a less-reactive surface to the deposited metal of polysilicon. As a result, clustering of all steps, high-k deposition, post deposition treatments including fluorination, and gate electrode deposition, without exposure to ambient is believed to be superior to other processes performed unclustered.

One embodiment of the integrated processing system 500 configured to form a high-K dielectric layer comprises processing chamber 536A adapted to perform the fluorination process as described above, processing chamber 536B adapted to perform a process such as a chemical vapor deposition chamber or an atomic layer deposition chamber, adapted to deposit a high dielectric constant material, such as a hafnium containing layer. In another embodiment, processing chamber 536C comprises a rapid thermal processing (RTP) chamber where the structure may be annealed. The RTP chamber may be a XE, XE Plus or Radiance chamber available from Applied Materials, Inc. In another embodiment, processing chamber 536D comprises a low pressure chemical vapor deposition chamber (LPCVD), such as a POLYgen chamber, available from Applied Materials, Inc, adapted to deposit a gate dielectric layer. Other embodiments of the system 500 are within the scope of the present invention. For example, the position of a particular processing chamber on the system may be altered or the number of processing chamber may be altered.

Figure 6:
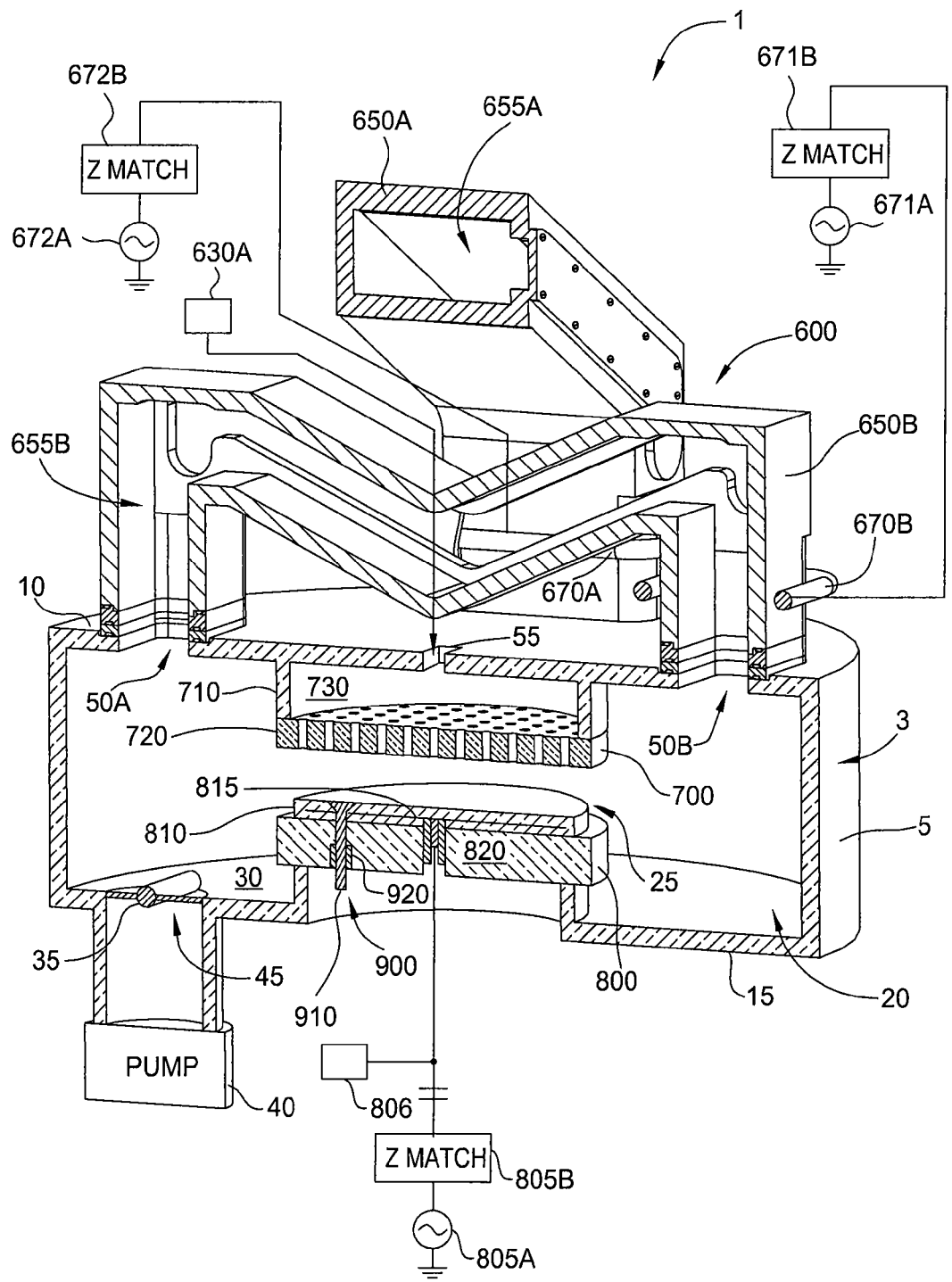
FIG. 6 is an isometric cross-sectional view of a plasma chamber for use with embodiments of the present invention.

FIG. 6 is an isometric cross-sectional view of one embodiment of a plasma chamber 1 that may be configured for a plasma enhanced chemical vapor deposition (PECVD) process, a high density plasma chemical vapor deposition (HD-PCVD) process, an ion implantation process, an etch process, and other plasma processes. The plasma chamber 1 includes a torodial plasma source 600 coupled to a body 3 of the chamber 1. The body 3 includes sidewalls 5 coupled to a lid 10 and a bottom 15, which bounds an interior volume 20. Other examples of a plasma chamber 1 may be found in U.S. Pat. No. 6,939,434, filed Jun. 5, 2002 and issued on Sep. 6, 2005 and U.S. Pat. No. 6,893,907, filed Feb. 24, 2004 and issued May 17, 2005, both of which are incorporated by reference herein in their entireties.

The interior volume 20 includes a processing region 25 formed between a showerhead 700 and a substrate support 800. A pumping region 30 surrounds a portion of the substrate support 800. The pumping region 30 is in selective communication with a vacuum pump 40 by a valve 35 disposed in a port 45 formed in the bottom 15. In one embodiment, the valve 35 is a throttle valve that is adapted to control the flow of gas or vapor from the interior volume 20 and through the port 45 to the vacuum pump 40. In one embodiment, the valve 35 operates without the use of o-rings, and is further described in United States Patent Publication No. 2006/0237136, filed Apr. 26, 2005, which is incorporated by reference in its entirety.

The torodial plasma source 600 includes a first conduit 650A having a general "U" shape, and a second conduit 650B having a general "M" shape. The first conduit 650A and the second conduit 650B each include at least one antenna 670A, 670B that are used to form an inductively coupled plasma within an interior region 655A, 655B of each of the conduits 650A, 650B, respectively. Each antenna 670A, 670B may be a winding or a coil coupled to a power source, such as a RF power sources 671A, 672A. RF impedance matching systems 671B, 672B may also be coupled to each antenna 670A, 670B. Process gases, such as helium, argon, and other gases, may be provided to an interior region 655A, 655B of each of the conduits 650A, 650B, respectively. In one embodiment, the process gases may contain a dopant containing gases that is supplied to the interior regions 655A, 655B of each conduit 650A, 650B. In one embodiment, the process gas is delivered from a gas source 630A that is connected to a port 55 formed in the body 3 of the chamber 1.

In one embodiment, each opposing end of the conduits 650A, 650B are coupled to respective ports (ports 50A and 50B for conduit 650B are shown in this view) formed in the lid 10 of the chamber 1. During processing a process gas is supplied to the interior region 655A, 655B of each of the conduits 650A, 650B, and RF power is applied to each antenna 670A, 670B, to generate a circulating plasma path that travels through the ports, e.g. 50A-50B and the processing region 25. Specifically, in FIG. 6, the circulating plasma path travels through port 50A to port 50B, or visa versa, through the processing region 25 between the gas distribution assembly 700 and substrate support 800. Each conduit 650A, 650B includes a plasma channeling means 606 coupled between respective ends of the conduit and the ports, e.g. 50A-50B, which is configured to split and widen the plasma path formed within each of the conduits 650A, 650B.

The gas distribution plate 700, or showerhead, includes an annular wall 710 defining a plenum 730 between the lid 10 and a perforated plate 720. The perforated plate 720 includes a plurality of openings formed through the plate in a symmetrical or non-symmetrical pattern or patterns. Process gases, such as dopant-containing gases, may be provided to the plenum 730 from the port 55. Generally, the dopant-containing gas is a chemical consisting of the dopant impurity atom, such as boron (a p-type conductivity impurity in silicon) or phosphorus (an n-type conductivity impurity in silicon) and a volatile species such as fluorine and/or hydrogen.

Thus, fluorides and/or hydrides of boron, phosphorous, or other dopant species such as, arsenic, antimony, etc., can be dopant gases. For example, where a boron dopant is used, the dopant-containing gas may contain boron trifluoride ($BF_3$) or diborane ($B_2H_6$). The gases may flow through the openings and into the processing region 25 below the perforated plate 720. In one embodiment, the perforated plate is RF biased to help generate and/or maintain a plasma in the processing region 25.

The substrate support 800 generally includes an upper layer or puck 810 and a cathode assembly 820. The puck 810 includes a smooth substrate supporting surface and an embedded electrode 815 that can be biased by use of DC power source 806 to facilitate electrostatic attraction between a substrate and the substrate supporting surface of the puck 810. The embedded electrode 815 may also be used as an electrode that provides RF energy to the processing region 25 and form an RF bias during processing. The embedded electrode 815 may be coupled to a RF power source 805A and may also include an impedance match 805B. In one embodiment, the substrate support 800 is a substrate contact-cooling electrostatic chuck in which the portion of the chuck contacting the substrate is cooled. The cooling is provided by coolant channels (not shown) disposed in the cathode assembly 820 for circulating a coolant therein.

The substrate support 800 may also include a lift pin assembly 900 that contains a plurality of lift pins 910 (only one is shown in this view). The lift pins 910 facilitate transfer of one or more substrates by selectively lifting and supporting a substrate above the puck 810, and are spaced to allow a robot blade (not shown) to positioned therebetween. The lift pin assemblies 900 contain bushings 920 that are coupled to one or both of the puck 810 and the cathode assembly 820.

While the above embodiments are described with respect to FIGS. 4, 5, and 6, it is recognized that other integrated processing systems and chamber combinations may be used with the embodiments described herein. Furthermore, any number of processing chambers may be part of a non-integrated system.

While the foregoing is directed to embodiments of the present invention, other and further embodiments of the invention may be devised without departing from the basic scope thereof, and the scope thereof is determined by the claims that follow.

The invention claimed is:

1. A method for forming a semiconductor device, comprising:
   introducing a substrate into a first processing chamber;
   forming a high-k dielectric layer having a desired thickness on a surface of the substrate in the first processing chamber;
   transferring the substrate to a second processing chamber without exposing the substrate to ambient;
   exposing the substrate to a low energy plasma comprising a fluorine source gas to form a fluorinated high-k dielectric layer on the substrate without etching the high-k dielectric layer in the second processing chamber;
   transferring the substrate to a third processing chamber without exposing the substrate to ambient; and
   forming a gate electrode on the substrate fluorinated high-k dielectric layer in the third processing chamber.

2. The method of claim 1, wherein the fluorine source gas is selected from a group consisting of $F_2$, $NF_3$, HF, and combinations thereof.

3. The method of claim 2, further comprising co-flowing a gas selected from a group consisting of argon, helium, $N_2$, $O_2$, and combinations thereof with the fluorine source gas.

4. The method of claim 1, wherein the fluorine source gas comprises a carbon free gas.

5. The method of claim 1, wherein exposing the substrate to a low energy plasma comprising a fluorine source gas occurs at a substrate temperature of less than 100° C.

6. The method of claim 1, wherein the low energy plasma is formed using a pulsed source inductive plasma.

7. The method of claim 1, wherein the gate electrode is a metal gate electrode selected from a group consisting of titanium, titanium nitride, tantalum, tantalum nitride, tungsten, and tungsten nitride.

8. The method of claim 1, wherein the exposing the substrate to a low energy plasma comprising a fluorine source gas occurs after forming a high-k dielectric layer having a desired thickness on a surface of a substrate.

9. The method of claim 1, wherein a concentration of fluorine in the fluorinated dielectric layer is between $1E14$ atoms/cm$^2$ and $4E15$ atoms/cm$^2$.

10. The method of claim 1, wherein the high-k dielectric layer contains at least one material selected from a group consisting of, hafnium oxide, zirconium oxide, hafnium silicate oxides, hafnium aluminate, hafnium lanthanum oxides, lanthanum oxides, and aluminum oxide.

11. The method of claim 1, further comprising:
    transferring the substrate to a fourth processing chamber without exposing the substrate to ambient; and
    annealing the high-k dielectric layer in the fourth processing chamber prior to transferring the substrate to the second processing chamber.

12. The method of claim 11, further comprising:
    transferring the substrate to the fourth processing chamber without exposing the substrate to ambient; and
    annealing the fluorinated high-k dielectric layer in the fourth processing chamber prior to transferring the substrate to the third processing chamber.

13. A method of forming a high-k gate stack, comprising:
    forming a high-k dielectric layer on a substrate;
    annealing the high-k dielectric layer;
    exposing the substrate to a low ion energy fluorine containing plasma to form a fluorinated high-k dielectric layer and to passivate oxygen vacancies and other bonding defects in the high-k gate stack;
    annealing the fluorinated high-k dielectric layer; and
    forming a gate electrode on the fluorinated high-k dielectric layer.

14. The method of claim 13, wherein exposing the substrate to a low ion energy fluorine containing plasma comprises providing an RF power between about 50 watts and about 1000 watts.

15. The method of claim 13, wherein the low ion energy plasma is formed by applying an RF power selected so that no etching of the dielectric layer occurs.

16. The method of claim 13, wherein exposing the substrate to a low ion energy fluorine containing plasma comprises performing a pulse radio frequency plasma process selected from a group consisting of inductive pulse plasma, continuous wave capacitive source plasma, and continuous wave mixed inductive and capacitive source plasma.

17. The method of claim 13, wherein the high-k dielectric layer is a metal oxide containing layer.

18. The method of claim 13, wherein exposing the substrate to a low energy plasma comprising a fluorine source gas occurs at a substrate temperature of less than 100° C.

* * * * *

UNITED STATES PATENT AND TRADEMARK OFFICE
CERTIFICATE OF CORRECTION

PATENT NO. : 7,902,018 B2  
APPLICATION NO. : 11/861578  
DATED : March 8, 2011  
INVENTOR(S) : Kraus et al.

Page 1 of 1

It is certified that error appears in the above-identified patent and that said Letters Patent is hereby corrected as shown below:

In the Claims:

Column 11, Claim 1, Line 60, please delete "substrate".

Signed and Sealed this  
Thirty-first Day of May, 2011

David J. Kappos  
*Director of the United States Patent and Trademark Office*